US006797533B2

(12) United States Patent
Thompson et al.

(10) Patent No.: US 6,797,533 B2
(45) Date of Patent: Sep. 28, 2004

(54) QUANTUM WELL INTERMIXING IN INGAASP STRUCTURES INDUCED BY LOW TEMPERATURE GROWN INP

(75) Inventors: David A. Thompson, Ontario (CA); Bradley J. Robinson, Hamilton (CA); Gregory J. Letal, Ontario (CA); Alex S. W. Lee, Ontario (CA); Brooke Gordon, Oakville (CA)

(73) Assignee: McMaster University, Hamilton (CA)

( * ) Notice: Subject to any disclaimer, the term of this patent is extended or adjusted under 35 U.S.C. 154(b) by 0 days.

(21) Appl. No.: 10/264,316

(22) Filed: Oct. 4, 2002

(65) Prior Publication Data

US 2003/0071265 A1 Apr. 17, 2003

Related U.S. Application Data

(63) Continuation-in-part of application No. 09/833,078, filed on Apr. 12, 2001.
(60) Provisional application No. 60/205,261, filed on May 19, 2000.

(51) Int. Cl.$^7$ .............................................. H01L 21/00
(52) U.S. Cl. ........................................ 438/48; 257/14
(58) Field of Search .............................. 257/14, 15, 16, 257/17, 18, 19, 20, 21, 22, 23, 24, 79, 9; 438/48, 590

(56) References Cited

U.S. PATENT DOCUMENTS

| | | | |
|---|---|---|---|
| 4,805,179 A | 2/1989 | Harder et al. | |
| 4,871,690 A | 10/1989 | Holonyak, Jr. et al. | |
| 5,011,794 A * | 4/1991 | Grim et al. | 438/796 |
| 5,298,454 A | 3/1994 | D'Asaro et al. | |
| 5,353,295 A | 10/1994 | Holonyak, Jr. et al. | |
| 5,395,793 A | 3/1995 | Charbonneau et al. | |
| 5,411,914 A * | 5/1995 | Chen et al. | 438/167 |
| 5,425,043 A | 6/1995 | Holonyak, Jr. et al. | |
| 5,455,429 A | 10/1995 | Paoli et al. | |
| 5,539,763 A | 7/1996 | Takemi et al. | |
| 5,548,610 A * | 8/1996 | Bouadma et al. | 372/99 |
| 5,574,745 A | 11/1996 | Paoli et al. | |
| 5,603,765 A * | 2/1997 | Matloubian et al. | 117/94 |
| 5,608,753 A | 3/1997 | Paoli et al. | |
| 5,707,890 A | 1/1998 | Emery et al. | |
| 5,708,674 A | 1/1998 | Beernink et al. | |
| 5,766,981 A | 6/1998 | Thornton et al. | |
| 5,771,256 A | 6/1998 | Bhat | |
| 5,843,802 A | 12/1998 | Beernink et al. | |
| 5,882,951 A | 3/1999 | Bhat | |
| 5,915,165 A | 6/1999 | Sun et al. | |
| 5,939,733 A * | 8/1999 | Sato | 257/94 |
| 5,985,743 A * | 11/1999 | Gardner | 438/527 |
| 6,027,989 A | 2/2000 | Poole et al. | |

OTHER PUBLICATIONS

G.J. Letal, D.A. Thompson, B.J.Robinson, J.G. Simmons, (2001), "Demonstration of a DFB laser with an integrated electro–absorption modulator produced using a novel quantum–well intermixing technique", Materials Science and Engineering, B80, pp. 232–235.

(List continued on next page.)

Primary Examiner—Long Pham
Assistant Examiner—Dana Farahani
(74) Attorney, Agent, or Firm—Blank Rome LLP (57) ABSTRACT

A quantum well structure having an indium gallium arsenide phosphide (InGaAsP) quantum well active region has a low temperature grown indium phosphide (LT-InP) cap layer grown on it. Defects in the cap layer are intermixed into the quantum well active region by rapid thermal annealing to produce a blue shift in the active region. The blue shift increases as the growth temperature of the LT-InP cap layer decreases or as the phosphine flow rate during production of the LT-InP layer increases.

14 Claims, 8 Drawing Sheets

OTHER PUBLICATIONS

A.S.W. Lee, D.A. Thompson, B.J. Robinson, (2000), "Enhanced bandgap blue-shift in InGaAsp multiple-quantum-well laser structures by low-temperature-grown InP", Semicond. Sci. Technol., 15, L41-43.

A.S.W. Lee, M. Mackenzie, D.A. Thompson, J. Bursik, B.J. Robinson, and G.C. Wealherly, (2001), "Enhanced bandgap blueshift due to group V intermixing in InGaAsP multiple quantum well laser structures induced by low temperature grown InP", Applied Physics Letters, vol. 78, No. 21, pp. 3199-3201.

T. Yin, G.J. Letal, B.J. Robinson, D.A. Thompson, (2001), "The Effects of InP Grown by He-Plasma Assisted Epitaxy on Quantum Well Intermixing", Journal of Quantum Electronics, vol. 37, pp. 426-429.

D.A. Thompson, J.F. Hazell, A.S.W. Lee, T. Yin, G.J. Letal, B.J. Robinson, N. Bertsch and J.G. Simmons, (2000), "New methods of defect-enhanced quantum well intermixing and demonstrated integrated distributed feedback laser-modulator", Proc. Spie, 4078, pp. 148-162.

J.E. Haysom, P.J. Poole, R.L. Williams, S. Raymond, G.C. Ayers, (2000), "Diffusion of defects in InP studied using quantum well intermixing", Solid State Communications SSC5429, pp. 1-4.

J.E. Haysom, P.J. Poole, G.C. Ayers, S.J. Rolfe, S. Raymond, I.V. Mitchell, S. Charbonneau, (2000), "Quantum Well Intermixing Caused By Non-Stoichiometric INP", IPRM 2000—InP and Related Materials Conference, May 14-18, pp. 56-59.

H. Pinkney, D.A. Thompson, B.J. Robinson, L.Qian, S.D. Benjamin, P.W.E. Smith, (2000), "Growth of novel InP-based materials by He-plasma-assisted epitaxy", Journal of Crystal Growth, 209, pp. 237-241.

L. Qian, S.D. Benjamin, P.W.E. Smith, B.J. Robinson, D.A. Thompson, (1997), "Picosecond carrier lifetime and large optical nonlinearities in InGaAsP grown by He-plasma-assisted molecular beam epitaxy" Optics Letters, vol. 22, No. 2, pp. 108-110.

J.U. Kang, M.Y. Frankel, R.D. Esman, D.A. Thompson, B.J. Robinson, (1998), "InGaAsP grown by He-plasma-assisted molecular beam epitaxy for 1.55 $\mu$m high speed photodetectors", Applied Physics Letters, vol. 72, No. 11, pp. 1278-1280.

L. Qian, S.D. Benjamin, P.W.E. Smith, B.J. Robinson, and D.A. Thompson, (1997), "Subpicosecond carrier lifetime in beryllium-doped InGaAsP grown by He-plasma-assisted molecular beam epitaxy", Applied Physics Letters 71(11), pp. 1513-1515.

J.U. Kang, M.Y. Frankel, R.D. Esman, D.A. Thompson, B.J. Robinson, (1998), "Dependence of carrier lifetime and resistivity on annealing in InP grown by He-plasma-assisted molecular beam epitaxy", Journal of Applied Physics, vol. 83, No. 6, pp. 3423-3425.

L. Qian, P.W.E. Smith, M.A. Matin, H. Pinkney, B.J. Robinson, and D.A. Thompson, (2000), "Ultrafast carrier dynamics in InGaAsP grown by He-plasma-assisted epitaxy", Optics Communtications, vol. 185, pp. 487-492.

L. Qian, P.W.E. Smith, B.J. Robinson, D.A. Thompson, (2001), "An ultrafast all-optical asymmetric Fabry-Perot switch based on bulk Be-doped InGaAsP grown by He-plasma-assisted epitaxy", Opt. Quantum Electron. Special Issue on Components for Ultrafast Communications.

H. Pinkney, D.A. Thompson, B.J. Robinson, P. Mascher, P.J. Simpson, U. Myler, J.U.Kang and M.Y. Frankel, (1998), "Characterization of annealed high-resistivity InP grown by He-plasma-assisted epitaxy", J. Vac. Sci. Technology A 16(2), pp. 772-775.

H. Pinkney, D.A. Thompson, B.J. Robinson, P.J. Simpson, U. Myler, R.W. Streater, (1999), "Characterization of He-P-lasma-Assisted GSMBE InGaAsP", IEEE Publication 99CH36362, pp. 143-146.

L. Qian, S.D. Benjamin, P.W.E. Smith, B.J. Robinson, D.A. Thompson, (1999), "Dual-wavelength pump probe measurements on helium-plasma-grown InGaAsP reveal complex carrier dynamics", Conf. On Lasers & Electrophysics, CLEO '99.

D.B. Mitchell, B.J. Robinson, D.A. Thompson, L. Qian, S.D. Benjamin, P.W.E. Smith, (1996), "He-plasma assisted epitaxy for highly resistive, optically fast InP-based materials", Appl. Phys. Lett. 69 (4), pp. 509-511.

J.S. Tsang, C.P. Lee, S.H. Lee, K.L. Tsai, C.M. Tsai and J.C. Fan; "Compositional Disordering of InGaAs/GaAs heterostructures by low-temperature-grown GaAs Layers", J. Appl. Phys., 79(2), pp. 664-670.

Journal of Crystal Growth (2000), "Growth of novel InP-based materials by He-plasma-assisted epitaxy," Authors: Pinkney et al.; pp. 237-241.

J. Vac. Sci. Technol. A 16(2), Mar./Apr. 1998, "Characterization of annealed high-resisivity InP grown by He-plasma-assisted epitaxy," Authors: Pinkney et al.; pp. 772-775.

J. Vac. Sci. Technol. A 16(2), Mar./Apr. 1998, "Quantum well intermixing in material systems for 1.5 $\mu$m (invited)," Authors: Marsh et al.; pp. 810-816.

IEEE Photonics Technology Letters, vol. 8, No. 9, Sep. 1996, "10 Gb/s Wavelength Conversion with Integrated Multiquantum-Well-Based 3-Port Mach-Zehnder Interferometer," Authors: Idler et al.; pp. 1163-1165.

J. Appl. Phys. 79(2), Jan. 15, 1996, "Compositional disordering of InGaAs/GaAs heterostructures by low-temperature-grown GaAs layers," Authors: Tsang et al.; pp. 664-670.

IEEE Photonics Technology Letters, vol. 7, No. 9, Sep. 1995, "Monolithic Integration of InGaAsP-InP Stratined-Layer Distributed Feedback Laser and External Modulator by Selective Quantum-Well Interdiffusion," Authors: Ramdane et al.; pp. 1016-1018.

"Quantum Well Intermixing Caused By Non-Stoichiometric INP," Authors: Haysom et al.; pp. 56-59.

Semicond.Sci.technol. 15 (2000) L-41-43. Printed in the UK, "Enhanced Bandgap Blue-shift in InGaAsP Multiple-Quantum-Well Laser Structures by Low-Temperature-Grown InP", Authors: ASW Lee, DA Thompson and BJ Robinson.

* cited by examiner

| | |
|---|---|
| 100nm LT-InP or NT-InP cap layer (undoped) | 324 |
| 5 or 10nm InGaAs etch stop (undoped) | 322 |
| 100nm or 2μm InP buffer (undoped) | 320 |
| 5nm InGaAs etch stop (undoped) | 318 |
| 25nm InP (undoped) | 316 |
| 80nm λ=1.15μm InGaAsP cladding (undoped or p=$5 \times 10^{17}$ cm$^{-3}$) | 314 |
| 70nm λ=1.24μm InGaAsP barrier (undoped) | 312 |
| 5nm QW In$_{0.76}$Ga$_{0.24}$As$_{0.85}$P$_{0.15}$ | 310e |
| 10nm barrier In$_{0.76}$Ga$_{0.24}$As$_{0.52}$P$_{0.48}$ | 310d |
| 5nm QW In$_{0.76}$Ga$_{0.24}$As$_{0.85}$P$_{0.15}$ | 310c |
| 10nm barrier In$_{0.76}$Ga$_{0.24}$As$_{0.52}$P$_{0.48}$ | 310b |
| 5nm QW In$_{0.76}$Ga$_{0.24}$As$_{0.85}$P$_{0.15}$ | 310a |
| 70nm λ=1.24μm InGaAsP barrier (undoped) | 308 |
| 80nm λ=1.15μm InGaAsP cladding (n=$5 \times 10^{17}$cm$^{-3}$) | 306 |
| 500 or 300nm InP buffer (n=$1 \times 10^{18}$cm$^{-3}$) | 304 |
| n+ InP substrate | 302 |

QUANTUM WELL INTERMIXING IN INGAASP STRUCTURES INDUCED BY LOW TEMPERATURE GROWN INP

REFERENCE TO RELATED APPLICATIONS

The present application is a continuation-in-part of U.S. patent application Ser. No. 09/833,078, filed Apr. 12, 2001, published on Mar. 14, 2002, as U.S. Ser. No. 2002/0030185 A1, which claims the benefit of U.S. Provisional Application No. 60/205,261, filed May 19, 2000. The disclosures of both of the above-referenced applications are hereby incorporated by reference in their entireties into the present application.

FIELD OF THE INVENTION

This invention relates to quantum well devices and to a method of changing and/or controlling the effective bandgap energy in quantum well structures, particularly Indium Gallium Arsenide Phosphide (InGaAsP) devices or structures. More particularly, it is concerned with improving the characteristics of such devices, particularly their blue shift, through the use of a low temperature grown indium phosphide (LT-InP) cap layer.

DESCRIPTION OF RELATED ART

The semiconductor industry is currently interested in integrating various optoelectronic devices, such as lasers, modulators and detectors, within a single semiconductor structure. This initiative is motivated by the increasing demand for optoelectronic technology particularly in the optical telecommunications field.

Integrated optoelectronic devices are of great interest due to the optical alignment and optical coupling efficiency challenges associated with using discrete optoelectronic devices. Within an integrated optoelectronic device, each optical component is spatially self aligned as result of being fabricated within the same semiconductor structure. This inherently gives better transmission between the components of an integrated device, as compared to putting together discrete devices. However, in order to ensure that each of the separate optical components within the structure has its own independent characteristics, local modifications to the semiconductor quantum well structure of each component are usually necessary. Many known fabrication techniques for one component of an integrated structure tend to have the unwanted effect of distorting or affecting properties of neighboring components.

Quantum Well Intermixing (QWI) is a post-growth method of bandgap engineering known in the art, enabling controlled changes in the bandgap energy of selected regions of the quantum well structure. Quantum Well Intermixing uses a Rapid Thermal Annealing (RTA) process, also known in the art, to provide controlled diffusion of defects into the quantum well structure of an optoelectronic device. These defects are usually provided by a layer or layers of specially grown material that are grown above the quantum well structure. Under the influence of the RTA process, the defects diffuse down into the quantum well structure and introduce changes to the bandgap properties. QWI has attracted considerable interest in locally modifying the quantum well band structure of integrated optoelectronic devices, including tunable wavelength lasers, photodetectors, and modulators. It is believed to be capable of modifying one component with minimum impact on neighboring components.

Different thermally-driven quantum well intermixing techniques such as Ion-Implantation Disordering (IID), Impurity Free Defect Diffusion (IFDD), Photo-absorption Induced Disordering (PAID) and Impurity-induced Layer Disordering (IILD) have been utilized in order to modify the quantum well structure in selected regions.

In Ion Implantation Disordering (IID), high energy implanted ions may introduce lattice damage to the quantum well structure, resulting in reduced light output. The Impurity-Induced Layer Disordering (IILD) technique requires long anneal times and/or high anneal temperatures (>800° C.) for diffusing impurities into the quantum well region. This can cause undesirable changes in the characteristics of neighbouring components within an integrated optoelectronic devices. It also introduces unwanted impurities, causing undesirable changes to the properties of the quantum well structure. The Impurity Free Defect Diffusion (IFDD) technique is free of impurities, but control of the QWI process depends on the deposited cap layer being used, its deposition conditions and the subsequent thermal anneal treatment. If, for example, a silicon dioxide ($SiO_2$) cap layer is used, the thermal anneal process requires the use of temperatures between 750–800° C. These anneal temperatures may cause an uncontrollable shift in device operating wavelength, such as the emission wavelength of laser devices. Also, the surface of the grown material may become unstable and therefore unsuitable for subsequent processing of components such as gratings. Furthermore, strain and damage may be introduced to the hetero-structure surface. Finally, Photo-absorption Induced Disordering (PAID) suffers from poor spatial resolution. Consequently, it is difficult to confine this effect to an intended component within an integrated device, without affecting adjacent components.

A QWI technique is described in the above-cited parent application. The technique will be disclosed here, with revisions to represent current knowledge.

Figure 1:
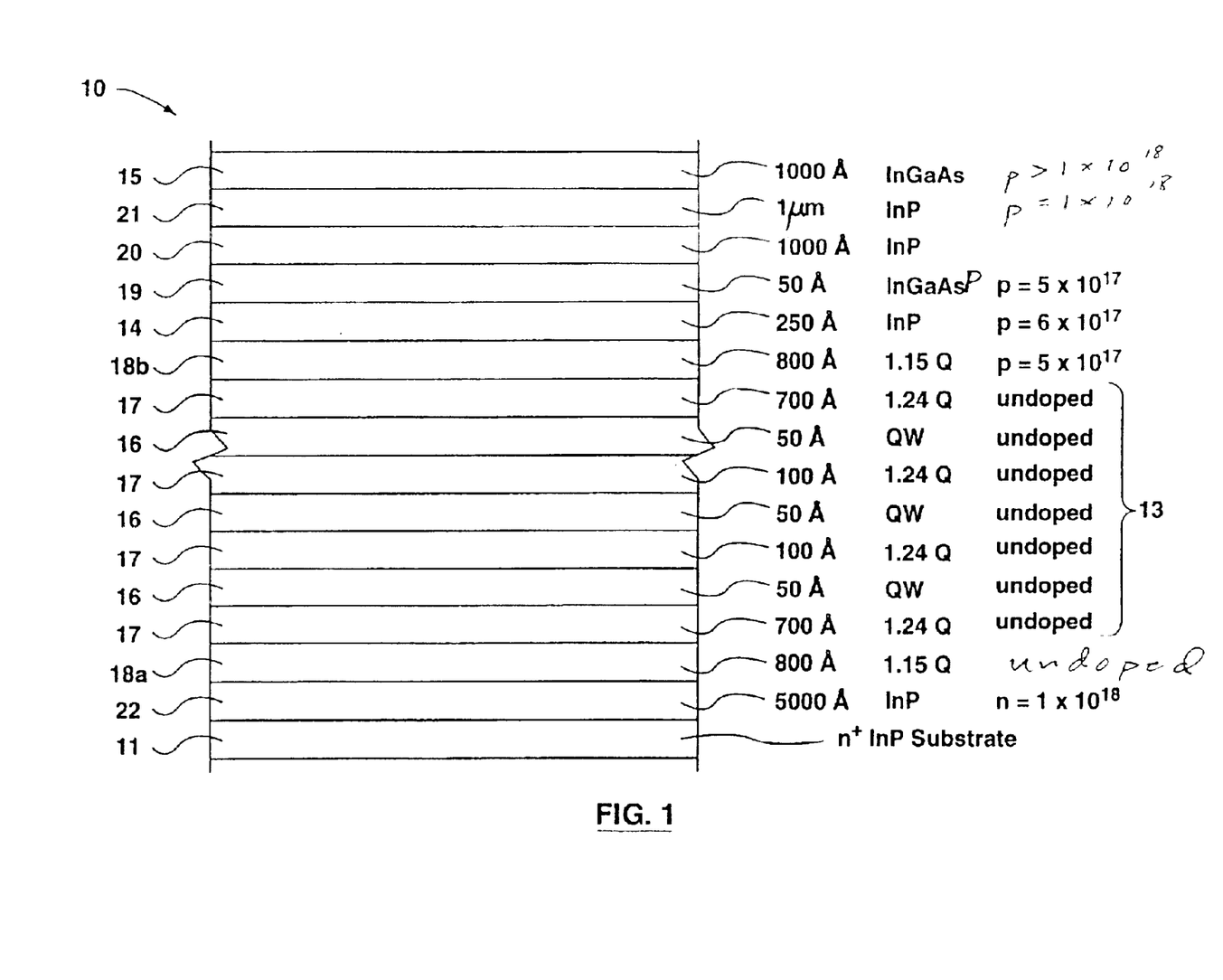
FIGS. 1 and 2 show schematics of two quantum well structures taught in the above-cited parent application.

FIG. 1 shows a typical InGaAsP multiple quantum well structure 10 of a laser device. The structure 10 is grown by GSMBE in sequential layers starting from a 5000 Å InP Buffer layer 22 which itself is formed on an n+InP substrate 11. The next layer grown on top of the InP buffer layer 22 is an 800 Å 1.15Q guiding layer 18*a*. The following layers grown above the guiding layer 18*a* form a conventional quantum well active region 13, which comprises three quantum well layers 16 and four 1.24Q quaternary layers 17. The 1.24Q quaternary layers 17 provide barrier regions of higher bandgap energy between the quantum well layers 16. Optical emissions are generated within this quantum well active region 13. A second 1.15Q guiding layer 18*b* is grown on top of the last quaternary layer 17. Optical emission generated in the active region 13 is mostly confined between the guiding layers 18*a*, 18*b* in order to concentrate the optical output emission from the laser device. A 250 Å InP grating layer 14 is grown above the second 1.15Q guiding layer 18*b* and used in the process of etching a grating for a Distributed Feed-Back (DFB) laser A 50 Å InGaAsP layer 19 grown above the InP grating layer 14 is used as an etch stop layer for removal of the LT-InP layer 20 after patterning and removal of the remaining InP defect layer, and completing the RTA process. This layer protects the underlying InP layer from being etched away during the removal of the InP defect layer 20. The layers 14, 19 and 20 are initially undoped but doped p-type at $5-6 \times 10^{17}$ upon growth over etched gratings. The InGaAsP layer 19 also protects the InP/1.15Q grating layers 14 and 18*b* from contamination prior to etching the grating. A 1000 Å InP defect layer 20 is grown above the InGaAsP layer 19 for the quantum well intermixing process. These defects have been postulated to be donor-like Phosphorus-antisites or acceptor-like Indium-Vacancies. Using standard photolithography, this layer is patterned and etched to define the areas to be modified by QWI During the RTA process, defects in the InP defect layer 20 diffuse into the quantum well region 13. On completion of the photolithography/etching and the RTA process, the defect layer 20, the etch stop layer 19 and the grating layer 14are etched away. This etching process may be used to introduce a grating, if required, into the 1.15Q guiding layer 18b. Subsequently the device structure will be completed with additional growth of layers which are typically in sequence InP 14, InGaAsP etch stop 19, InP 21 and finally the 1000 Å InGaAs contact layer 15. The InGaAs layer 15 is a contact layer for applying current to the device. Doping levels and type of these layers depends on the type of device being fabricated. The InGaAs contact layer and the layer of InP 21 is normally etched into a ridge structure for confining and guiding the applied device current from the InGaAs contact layer 15 to a narrow region of the quantum well active region 13. The 1 μm InP layer 21 and the InGaAs contact layer 15 are grown after the RTA process, once the quantum well active region structure 13 has been grown. All layers with the exception of the InP defect layer 20 are typically used in optoelectronic device fabrication. Once the InP defect layer 20 has been used in the quantum well intermixing process in accordance with the present invention, it is removed from the device structure 10.

In this example all layers of the quantum well structure 10 are grown by GSMBE at a rate of 1 μm/hr on an n-type InP substrate 11. Group V constituent atoms are supplied in the form of $As_2$ and $P_2$ derived from the pyrolysis of $AsH_3$ and $PH_3$ in a single, two zone low pressure cracker with a Ta catalyst operating at 1000° C. All layers except the InP defect layer 20 are grown at 470° C. with the group V total flow rate of 4 or 5 sccm. The InP defect layer 20 is grown at a low temperature (LT) of 300° C. and is referred to as LT-InP. Rapid thermal annealing (RTA) is carried out under a flowing nitrogen ambient, using a halogen lamp rapid thermal annealing system.

In accordance with the parent application, during the RTA process, point defects in the LT-InP defect layer 20 diffuse into the active region 13 of the quantum well structure 10 and modify its composite structure. This controlled inter-diffusion process causes a large increase in the bandgap energy of the quantum well active region 13. This is referred to as a wavelength blue shift. Applying wavelength blue shift to a selected region of the quantum well active region 13 increases its transparency without the need for external biasing. This is due to the quantum well bandgap increase which has a higher energy than the generated incident photons. Therefore, the generated photons pass through the transparent quantum well region without being absorbed by electron/hole pairs.

In an alternative embodiment disclosed in the parent application, two types of defect containing layers are grown for the quantum well intermixing process. Both are grown as individual layers on top of the quantum well active region structure, and the defects they contain diffuse into the quantum well active region following a rapid thermal annealing (RTA) process. One of the diffused defect types (LT-InP) generates a bandgap wavelength blue shift in the quantum well active region, resulting in the transparency of this region. The other (He-plasma InP) diffuses defects of a type that also decreases carrier lifetime in the quantum well active region as well as introducing a bandgap wavelength blue shift and transparency. This reduction in carrier lifetime enables the InGaAsP quantum well active region to exhibit an ultra high speed response, which is particularly suitable for enabling high speed integrated optoelectronic device fabrication. The following paragraphs describe the growth process and properties of these defect types in more detail.

Figure 2:
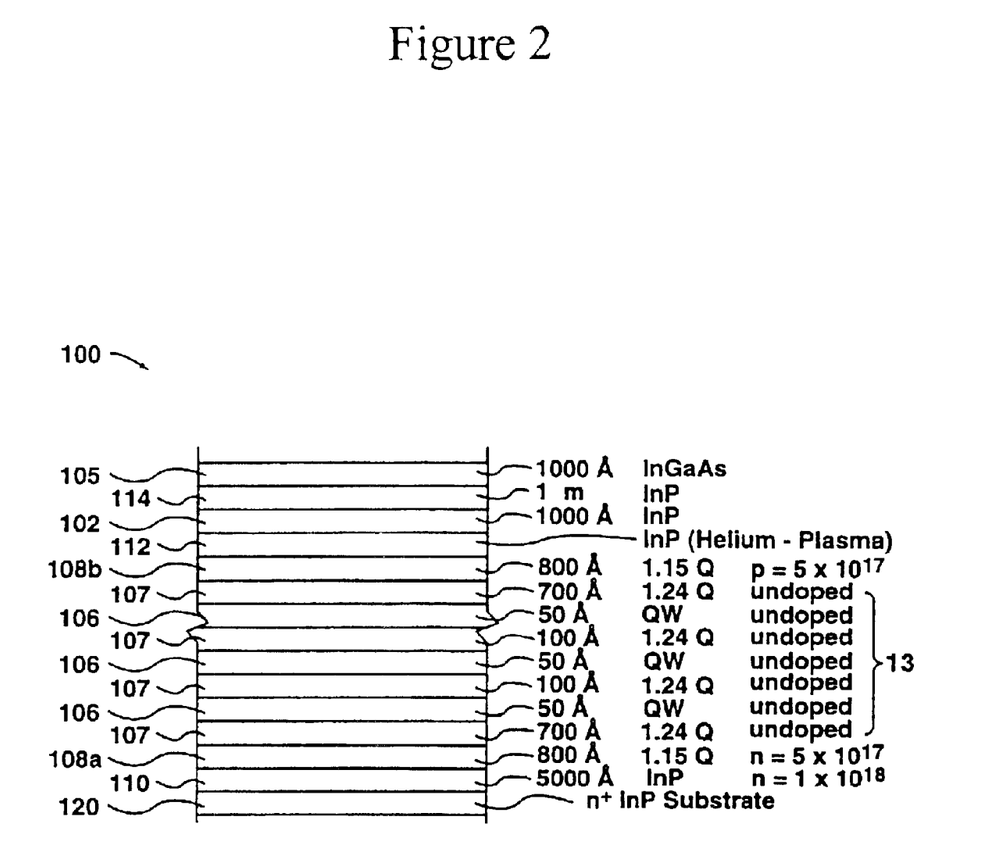

Referring to FIG. 2, the InGaAsP quantum well structure is grown on a 5000 Å InP buffer layer 110 which itself is formed on an n+ InP substrate 120. The next layer grown on top of the InP buffer layer 110 is an 800 Å 1.15Q guiding layer 108a. The following layers grown above the guiding layer 108a form a conventional quantum well active region 103, which comprises three quantum well layers 106 and four 1.24Q quaternary layers 107. The 1.24Q quaternary layers 107 provide barrier regions of higher bandgap energy between the quantum well layers 106. Optical emissions are generated within this quantum well active region 103. A second 1.15Q guiding layer 108b is grown on top of the last quaternary layer 107. Optical emission generated in the active region 103 is confined between the guiding layers 108a, 108b in order to concentrate the optical output emission from the laser device. An InP defect layer 112 is grown above the second 1.15Q guiding layer 108b. This InP layer 112 is grown using a combination of GSMBE and an electron cyclotron resonance (ECR) Helium-Plasma source. During growth, the InP layer 112 is grown under conventional GSMBE conditions, except that the epilayers of the InP 112 are exposed to a flux of helium particles from an ECR source mounted on the growth chamber. By exposing the InP layer 112 to the Helium flux, diffusing vacancy-type defects are produced in the InP layer 112. The thickness of this InP defect layer 112 can be optimized for particular device performance, but successful performance has been demonstrated for a defect layer 112 thickness of 400 Å. This is usually covered with an InP layer of 1000 Å thickness 102 grown at normal temperature (NT-InP). Using standard photolithography these layers are patterned and etched to define the areas to be modified by QWI. On completion of the photolithographic patterning/etching and the RTA process, the layers 102, and 112 (defect layer) are etched away and a thick 1 μm layer of InP 114 is grown in its place. A 1000 Å InGaAs contact layer 105 is grown over the 1 μm InP layer 114, wherein the InGaAs layer 105 is a contact layer for applying current to the device. The 1 μm layer of InP 114 is normally etched into a ridge structure for laterally confining the light and guiding the applied device current from the InGaAs contact layer 105 to a narrow region of the quantum well active region 103. The 1 μm InP layer 114 and the InGaAs contact layer 105 are grown after the RTA process, hence on top of the 1.15Q layer 18b which may contain a grating for a DFB laser. All layers with the exception of the InP layers 102, and 112 (defect layer) are typically used in optoelectronic device fabrication. In accordance with this aspect of the present invention, the InGaAsP etch stop layer previously shown in FIG. 1 is not grown over the quantum well active region 103 where quantum well intermixing occurs. This is due to the InGaAsP etch stop layer obstructing the diffusion of the defects into the quantum well active region 103.

Once quantum well intermixing is induced by the rapid thermal anneal (RTA) process, the defects in the InP defect layer 112, diffuse into the quantum well active region. These vacancy-type defects in the He-plasma InP layer 112 diffuse into the quantum well active region 103, providing both QWI and deep states that quench the photoluminescence and reduce carrier lifetime within the bandgap. The deep states are intermediate energy levels created within the bandgap of the quantum well active region 103. These intermediate states suppress radiative transitions within the quantum well active region 103, by providing an additional carrier recombination step during conduction band to valence band carrier recombination. The resulting short recombination times of carriers between the conduction band and intermediate deep state levels decreases the carrier lifetime. The diffusing group V vacancy-type type defects also cause QWI as they diffuse into the quantum well active region 103, generating a bandgap wavelength blue shift. This causes the quantum well active region 103 to become transparent, permitting incident photons to pass through this region without being absorbed.

The thickness of the InP defect layer 112 has to be sufficient to supply enough deep states to the quantum well active region 103 whilst simultaneously producing sufficient wavelength blue shift. The physical order of the layers 112, 102 must also be maintained during GSMBE growth Or the defects from the He-plasma InP 112 must diffuse further in order to reach the active region 13 requiring higher RTA temperatures or times in order to obtain the desired wavelength blues hift and reduced carrier lifetime. Once the RTA process is complete, the defect layers 102, 112 are etched away, and current guiding and contact layers 114, 105 are grown for applying electrical current to the device.

However, improvements can still be made to the technique disclosed in the parent application, particularly in terms of producing the blue shift.

SUMMARY OF THE INVENTION

It is an object of the present invention to improve the production of the devices just described and particularly their blue shift and their speed of response to an applied signal voltage. To that end, the present invention discloses Quantum Well Intermixing (QWI) methods for locally modifying the effective bandgap energy in Indium Gallium Arsenide Phosphide (InGaAsP) quantum well structures. A low-temperature-grown indium phosphide (LT-InP) cap layer is used to improve intermixing and thus the blue shift whilst maintaining a high optical emission quality. By applying a rapid thermal annealing (RTA) process, defects in the LT-InP layer diffuse to the quantum well active region. This controlled inter-diffusion process provides localized, controlled changes in the properties and bandgap energy of the quantum well active region.

Experiments have been performed to determine the dependence of the blue shift on the temperature at which the LT-InP layer is grown and on the phosphine flow rate used in growing the LT-InP layer. Those experiments prove the improvement in blue shift offered by the present invention compared to other methods described earlir. Specifically the RTA conditions are less severe thereby greatly decreasing the potential for degradation of the semiconductor structure and device performance.

A second process of implementing QWI has also been described which uses a He plasma InP layer. This process produces both QWI induced blue shifts and simultaneously act to introduce defects that quench light emission thereby making the structure more rapidly responsive to any input signal.

BRIEF DESCRIPTION OF THE DRAWINGS

For a better understanding of the present invention and to show more clearly how it may be carried into effect, reference will be made by way of example to the accompanying drawings, in which.

DETAILED DESCRIPTION OF THE PREFERRED EMBODIMENT

A quantum well intermixing method is described, wherein the effective bandgap properties of Indium Gallium Arsenide Phosphide (InGaAsP) quantum well structures are modified in order to enable fabrication of high-speed integrated optoelectronic devices. InGaAsP structures operate at emission wavelengths in the region of 1.55 μm and 1.3 μm, and are particularly used in optoelectronic devices applicable to optical fiber telecommunications. The described method includes process steps based on Gas Source Molecular Beam Epitaxy (GSMBE), patterning/etching and rapid thermal annealing (RTA), for achieving Quantum Well Intermixing (QWI) in the active region of InGaAsP quantum well structures. It should be appreciated that the GSMBE and RTA processes are known to someone skilled in the art, and are therefore not described in detail. Throughout the disclosure, it will be understood that the fabrication techniques can be the same as those disclosed in the above-cited parent application, except where noted. Sample numbers noted in the specification were those used in the laboratory during experimental testing of the devices to be described.

Figure 3:
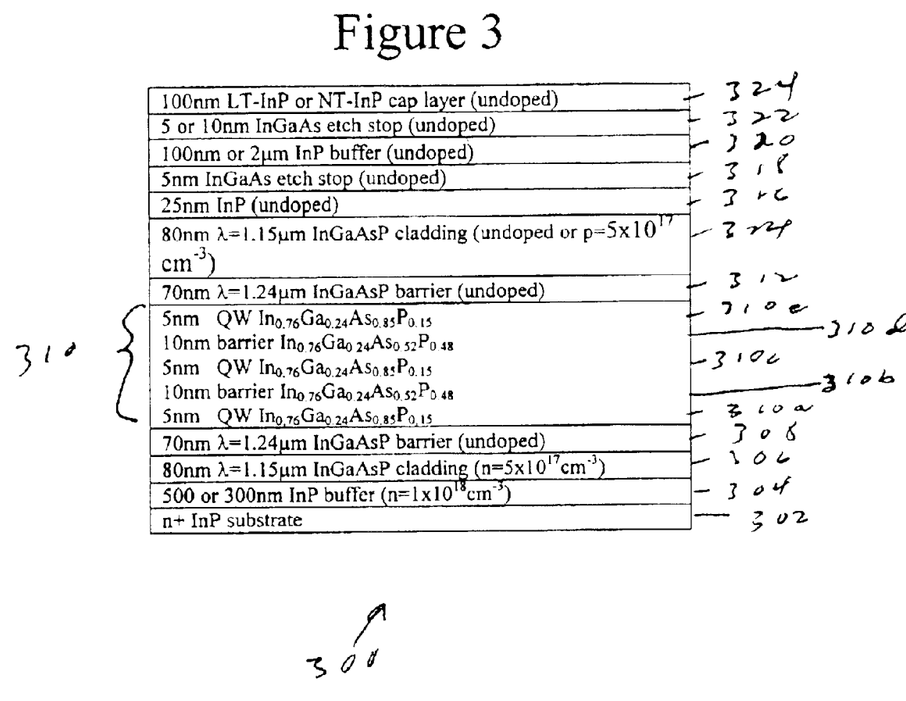
FIGS. 3, 4A and 4B show schematics of three quantum well structures grown for the purpose of further evaluation of the LT-InP process according to the present invention.

FIG. 3 shows a schematic of partial layer structures 300 for samples 3200 to 3714 used to study the LT-InP caps: On an n+ InP substrate 302 are grown a 500 or 300 nm InP buffer layer (n=1×10$^{18}$ cm$^{-3}$) 304, an 80 nm λ=1.15 μm InGaAsP cladding layer (n=5×10$^{17}$ cm$^{-3}$) 306 and a 70 nm λ=1.24 μm InGaAsP (undoped) barrier layer 308. Then, a quantum well structure 310 is formed, having the following layers: a 5 nm In$_{0.76}$Ga$_{0.24}$As$_{0.85}$P$_{0.15}$ QW layer 310a, a 10 nm In$_{0.76}$Ga$_{0.24}$As$_{0.52}$P$_{0.48}$ barrier layer 310b, a 5 nm In$_{0.76}$Ga$_{0.24}$As$_{0.85}$P$_{0.15}$ QW layer 310c, a 10 nm In$_{0.76}$Ga$_{0.24}$As$_{0.52}$P$_{0.48}$ barrier layer 310d, and a 5 nm In$_{0.76}$Ga$_{0.24}$As$_{0.85}$P$_{0.15}$ QW layer 310e. The InGaAsP layers 310a–310e in the quantum well structure 310 have a composition In$_a$Ga$_b$As$_c$P$_d$, where a+b=1 and c+d=1 to form a suitable III–V compound rather than a poor, highly defected material. On the quantum well structure 310, the following layers are formed: a 70 nm λ=1.24 μm InGaAsP (undoped) barrier layer 312, an 80 nm λ=1.15 μm InGaAsP (undoped or p=5×10$^{17}$ cm$^{-3}$) cladding layer 314, a 25 nm InP (undoped) layer 316, a 5 nm InGaAs etch stop (undoped) layer 318, a 100 nm or 2 μm InP buffer (undoped) layer 320, a 5 or 10 nm InGaAs etch stop (undoped) layer 322, and a 100 nm LT-InP or NT-InP cap layer (undoped) 324. The parameters for the fabrication of the cap layer 324 will be discussed below.

Figure 4A:
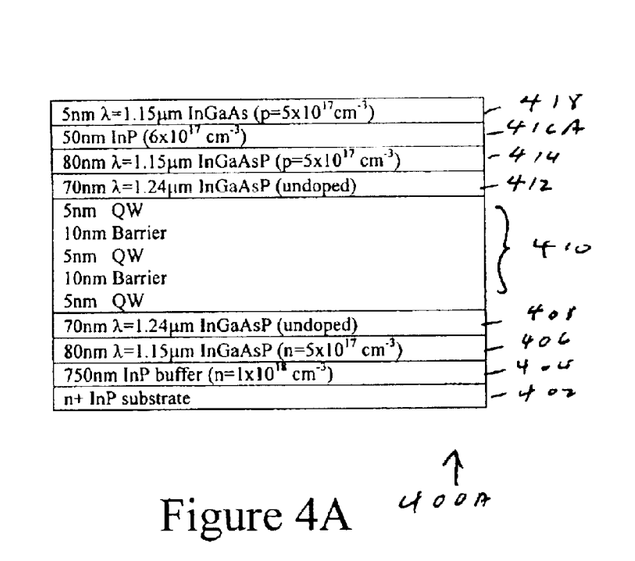
Figure 4B:
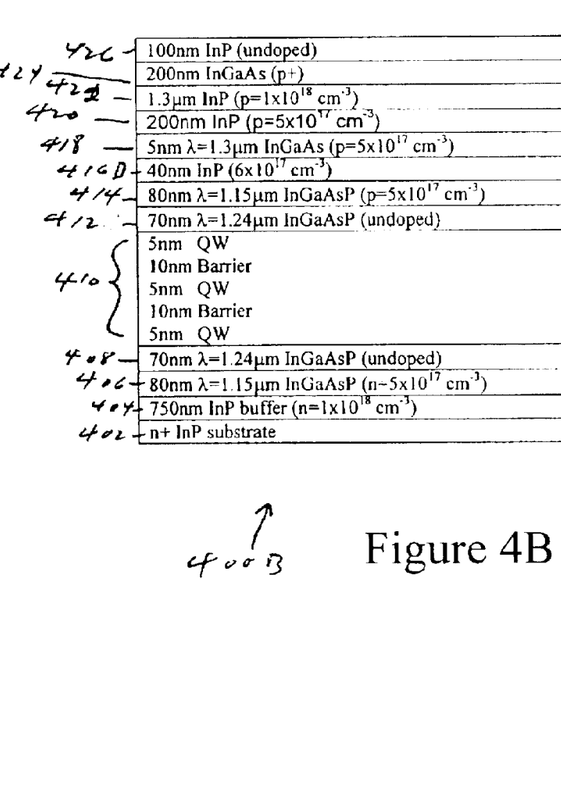

FIGS. 4A and 4B show the growth of laser structures. Sample 2645, shown in FIG. 4A, is a partial laser structure 400A. Samples 2649 and 2770, shown in FIG. 4B, are full laser structures 400B which differ by the growth temperature of the active region. Each of the structures has the following layers: an n+ InP substrate 402, a 750 nm InP buffer layer (n=1×10$^{18}$ cm$^{-3}$) 404, an 80 nm λ=1.15 μm InGaAsP (n=5×10$^{17}$ cm$^{-3}$) layer 406, a 70 nm λ=1.24 μm InGaAsP (undoped) layer 408, and a quantum well structure 410 having alternating 5 nm QW layers and 10 nm barrier layers. On top of the quantum well structure 410 are a 70 nm λ=1.24 μm InGaAsP (undoped) layer 412, an 80 nm λ=1.15 μm InGaAsP (p=5×10$^{17}$ cm$^{-3}$) layer 414, a 50 nm (in the partial laser structure 400A) or 40 nm (in the full laser structures 400B) InP (6×10$^{17}$ cm$^{-3}$) layer 416A or 416B, and a 5 nm λ=1.15 μm InGaAs (p=5×10$^{17}$ cm$^{-3}$) layer 418. In addition, the full laser structures 400B have the following layers: a 200 nm InP (p=5×10$^{17}$ cm$^{-3}$) layer 420, a 1.3 μm InP (p=1×10$^{18}$ cm$^{-3}$) layer 422, a 200 nm InGaAs (p+) layer 424 and a 100 nm InP (undoped) cap layer 426. The parameters for fabrication of the cap layer 426 will be discussed below.

FIGS. 3, 4A and 4B give details of the semiconductor structures that were used in the experiments. They all contain a standard laser active region 310 or 410 normally grown at 470° C. with different layers above the active region that were used to demonstrate different behavior to thermal treatments. The LT-active region sample had the active region grown at 430° C. and demonstrates that the QWI behaviour is quite insensitive to significant changes in the growth temperature.

Figure 5A:
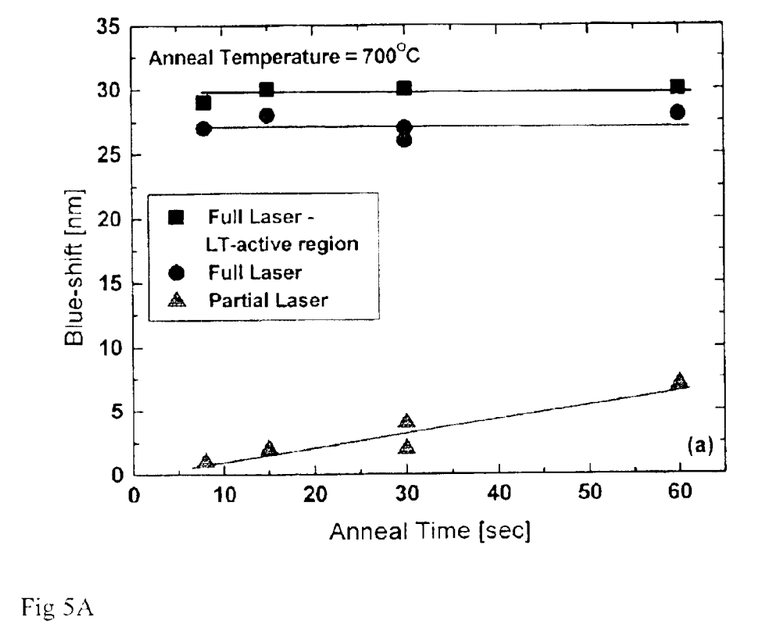
FIGS. 5A–5C show the thermal effects of anneal at various temperatures as a function of time for the structures of FIGS. 3, 4A and 4B.
Figure 5B:
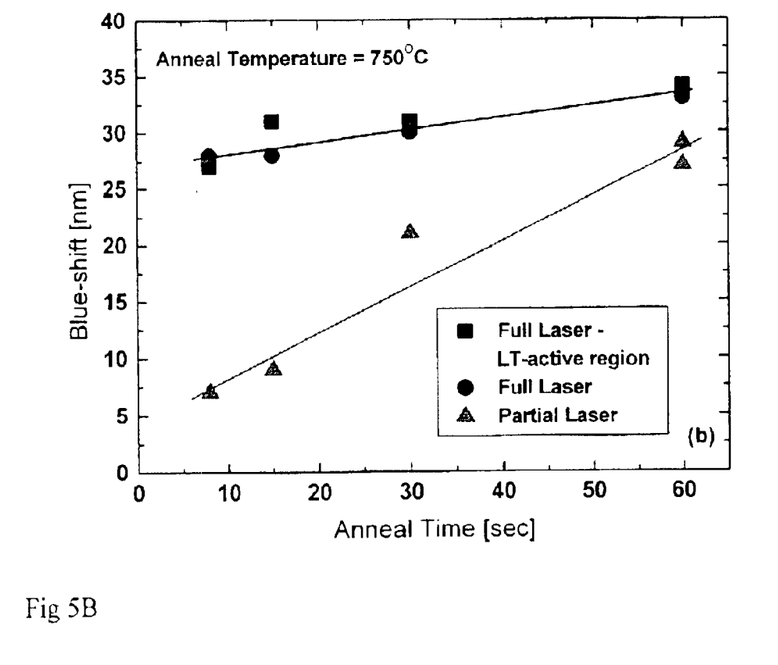
Figure 5C:
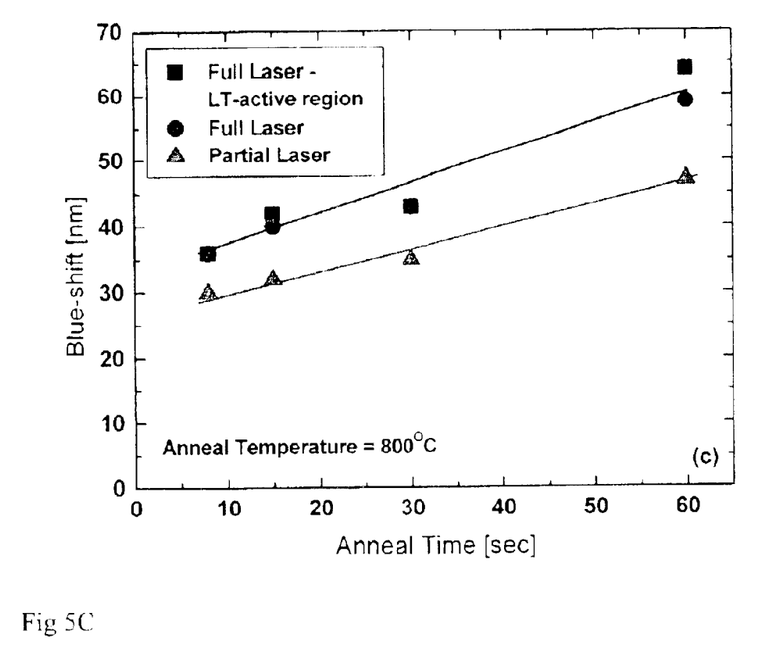

FIGS. 5A–5C show the results of subjecting the as-grown laser structures to thermal annealing at 700° C., 750° C. and 800° C., respectively. These data will form the basis for determining the effects of the LT-InP cap layer 324 or 426 when such a layer is added to the structures and the samples are annealed. The data indicates that the normally grown MBE material contains some grown-in defects in the active and cladding layers that need to be subtracted to determine the effects of annealing samples containing the LT-InP layer for enhancing quantum well intermixing. A significant blue-shift in the photoluminescence wavelength occurs in the first 5 sec in the full laser structure which contains a thick (2 μm) upper cladding layer of InP if that layer is doped with beryllium, but not if it is undoped. This effect is also absent in the partial laser structures where the upper InP cladding is only 100 nm. Clearly many defects are present in our normally grown InP and these diffuse on anneal to cause the blue-shift. Growing the active region at 430° C. instead of the normal 470° C. does produce a slightly larger blue-shift as would be expected since more defects would be present.

Figure 6:
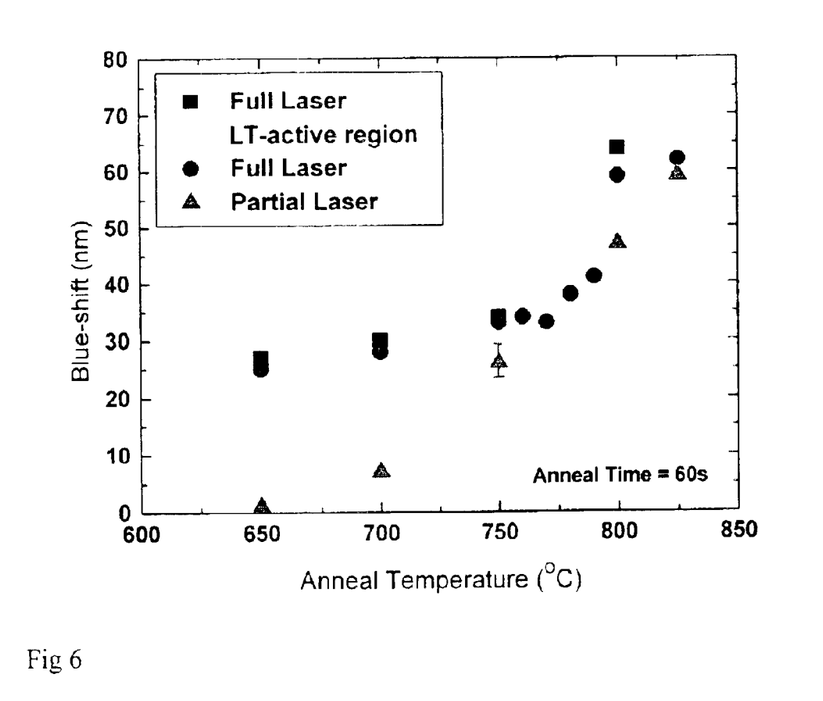
FIG. 6 shows the thermal effects of anneal as a function of temperature for 60 sec anneals for the structures of FIGS. 3, 4A and 4B.

FIG. 6 shows how the full and partial laser structures respond to thermal anneals for 60 sec at various temperatures. For anneals below ~750° C. the full laser structures show a larger blue-shift than the partial laser structures—as observed above. Above 750° C. the blue-shifts of the full and partial laser structures tend to be identical—the inventors interpret this as possibly related to surface defects being formed as a result of surface dissociation and phosphorus loss producing additional defects that diffuse to further increase the blue shift. This data suggests that the annealing temperature should be below 750° C.

The following data indicate the effects of the LT-InP on the quantum well intermixing process.

Figure 7:
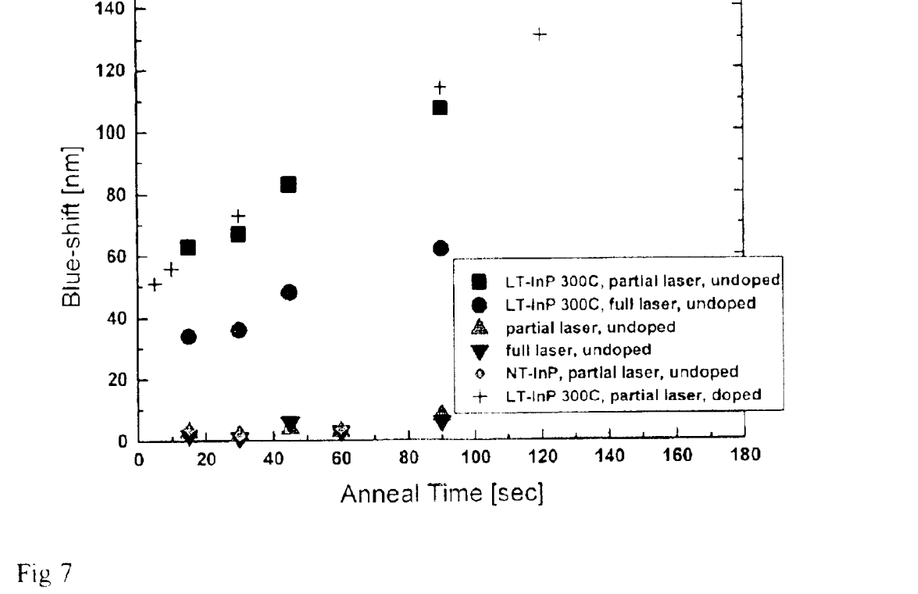
FIG. 7 shows the effect of 725° C. anneal as a function of time for various cladding and cap layers.

FIG. 7 compares the measured blue-shift as a function of anneal time for anneals at 725° C. for samples with and without a LT-InP layer grown at ~300° C. The following observations can be made.

For a partial laser structure, either NT-InP capped structures, or structures which initially had a LT-InP layer which was removed before anneal, exhibit the same amount of blue-shift—i.e., the effects of thermal anneal as shown in FIGS. 5A–5C and 6.

The LT-InP layer produces a large increase in the blue-shift over that without the LT-InP layer under the same anneal conditions.

A thicker cladding layer with the LT-InP reduces the blue-shift, indicating the longer diffusion distance between the source of defects (i.e. those contained in the LT-InP layer) which are responsible for the quantum well intermixing and the active region into which the defects are intermixed.

Doping the upper layers p-type—as would be required for a laser device—has some effect on the blue-shift.

Figure 8:
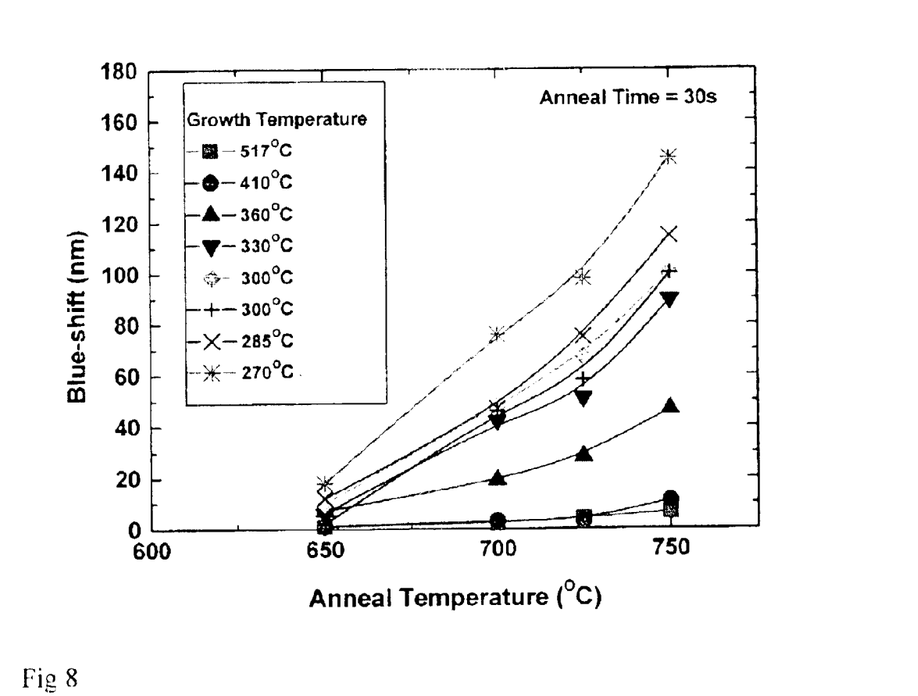
FIG. 8 shows the effect of 30 sec anneal as a function of temperature for various growth temperatures of the InP cap layer.

FIG. 8 shows the results of growing the LT-InP layers at different temperatures and annealing for 30 sec at 650–750° C. As expected from reports in the literature, lowering the growth temperature produces more defects—assigned as excess phosphorus present as P atoms sitting on an In site, i.e. a P-antisite defect (this is well known). However, nothing in the literature relates such defects and their concentration to the process of quantum well intermixing. The inventors surmise that the P-anti-sites dissociate into P-interstitial defects and In vacancies upon anneal and the P-interstitials diffuse in the reported exchange mechanism which is then responsible for P-As exchange and intermixing of the quantum wells and adjacent barrier layers causing the observed blue-shift. Lower growth temperature translates into a larger blue-shift.

Figure 9:
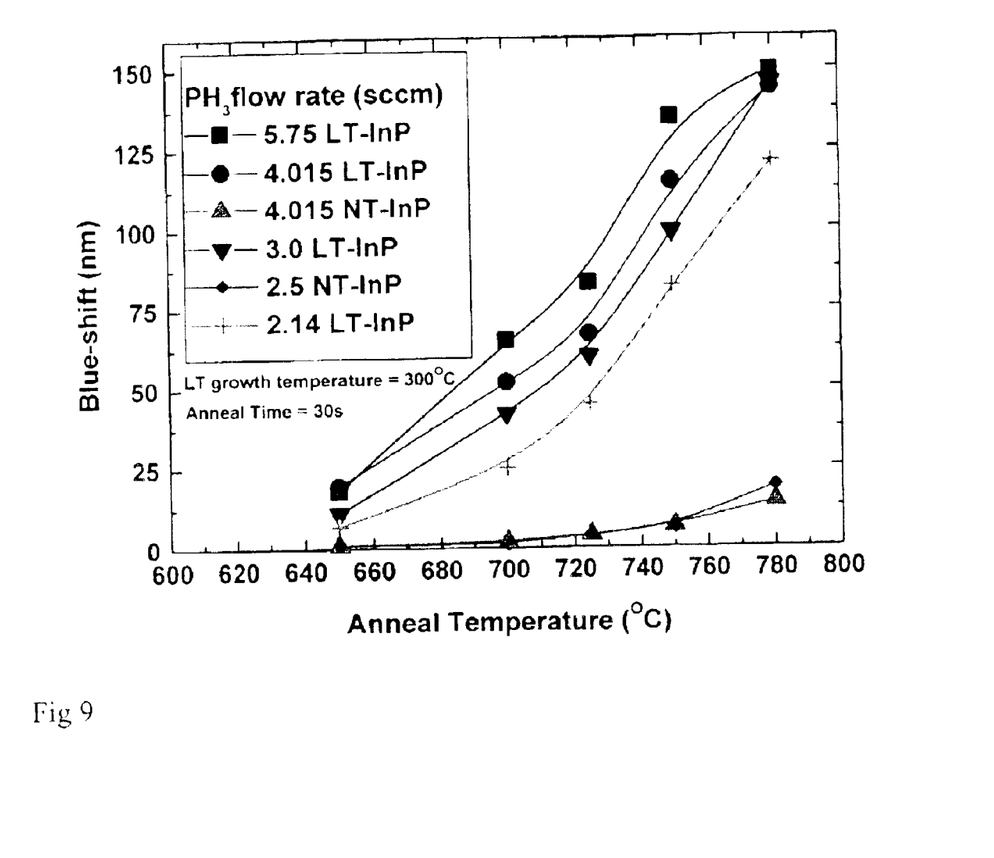
FIG. 9 shows the effect of anneal as a function of temperature and the phosphine flow rate during the growth of the cap layer.

FIG. 9 shows the effects of growing the LT-InP with different phosphine flow rates —hence different P$_2$ overpressures. The LT-InP growths were carried out at 300° C. and anneals were for 30 sec at 650–750° C. NT-InP samples were grown at 470° C. For the LT-InP growths lowering the phosphine flow (P$_2$ overpressure) reduces the blue-shift. This is consistent with the incorporation of less excess phosphorus at the lower flows and hence less defects to diffuse and produce the intermixing. Lowering the flow rate during the growth of NT-InP has essentially no effect—presumably at the higher temperature (470° C.) is sufficient to desorb all excess P$_2$; i.e., all except that which is incorporated into the correct lattice site where it is most strongly bound.

While a preferred embodiment of the present invention has been set forth in detail above, it will be readily apparent to those skilled in the art that other embodiments can be realized within the scope of the invention. For example, unless required to distinguish the present invention over the prior art, numerical values and ranges are illustrative rather than limiting. Also, the quantum well structure produced by the present claimed invention can be used in any of the devices disclosed in the above-cited parent application or in any other suitable devices. Therefore, the present invention should be construed as limited only by the appended claims.

What is claimed is:

1. A method of changing the bandgap energy in an Indium Gallium Arsenide Phosphide (InGaAsP) semiconductor quantum well structure, wherein the composition fraction for each of Indium, Gallium, Arsenide and Phosphide ranges from zero to one, such that the sum of the Ga and In fractions is one as is the sum of the P and As fractions, the method comprising:
   (a) providing a quantum well structure comprising an Indium Gallium Arsenide Phosphide (InGaAsP) quantum well active region;
   (b) on top of the quantum well structure, providing a low temperature grown Indium Phosphide (LT-InP) cap layer; and (c) applying a Rapid Thermal Annealing (RTA) process for controlled diffusion of defects in said low temperature grown Indium Phosphide cap layer, wherein said defects diffuse to the quantum well region.

2. The method of claim 1, wherein the LT-InP layer is undoped.

3. The method of claim 1, wherein the LT-InP layer is doped p-type.

4. The method of claim 1, wherein the LT-InP layer is grown at a temperature not above 300° C.

5. The method of claim 4, wherein the LT-InP layer is grown at a temperature not above 285° C.

6. The method of claim 5, wherein the LT-InP layer is grown at a temperature not above 270° C.

7. The method of claim 4, wherein the LT-InP layer is grown using a phosphine flow.

8. The method of claim 7, wherein the phosphine flow is at a rate of at least 2.14 sccm.

9. The method of claim 8, wherein the rate of the phosphine flow is at least 3.0 sccm.

10. The method of claim 9, wherein the rate of the phosphine flow is at least 4.015 sccm.

11. The method of claim 10, wherein the rate of the phosphine flow is at least 5.75 sccm.

12. The method of claim 1, wherein an InP cladding layer is formed between the quantum well active region and the LT-InP cap layer, and wherein a thickness of the InP cladding layer is no more than 100 nm.

13. The method of claim 1, wherein, during step (c), the cap layer is an uppermost layer of the quantum well structure.

14. The method of claim 1, wherein the RTA process is performed at a temperature below 750° C.

* * * * *